(12) United States Patent
Abe et al.

(10) Patent No.: US 7,560,754 B2
(45) Date of Patent: Jul. 14, 2009

(54) CMOS SOLID-STATE IMAGING DEVICE AND METHOD OF MANUFACTURING THE SAME AS WELL AS DRIVE METHOD OF CMOS SOLID-STATE IMAGING DEVICE

(75) Inventors: Hideshi Abe, Kanagawa (JP); Keiji Tatani, Kanagawa (JP); Kazuichiro Itonaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 605 days.

(21) Appl. No.: 11/231,918

(22) Filed: Sep. 21, 2005

(65) Prior Publication Data

US 2006/0065896 A1 Mar. 30, 2006

(30) Foreign Application Priority Data

Sep. 22, 2004 (JP) .......................... P2004-275461

(51) Int. Cl.
*H01L 31/00* (2006.01)

(52) U.S. Cl. ................. 257/222; 257/225; 257/E27.133
(58) Field of Classification Search ........................ None
See application file for complete search history.

(56) References Cited

U.S. PATENT DOCUMENTS

2008/0164500 A1* 7/2008 Shinohara et al. ........... 257/292

* cited by examiner

*Primary Examiner*—Evan Pert
*Assistant Examiner*—Scott R Wilson
(74) *Attorney, Agent, or Firm*—Sonnenschein Nath & Rosenthal LLP

(57) ABSTRACT

A CMOS solid-state imaging device configured to restrain the occurrence of white spots and dark current caused by pixel defects, and also to increase the saturation signal amount. Adjacent pixels are separated by an element isolation portion formed of a diffusion layer and an insulating layer thereon, and the insulating layer of the element isolation portion is formed in a position equal to or shallower than the position of a pn junction on the side of an accumulation layer of a photoelectric conversion portion 38 constituting a pixel.

7 Claims, 9 Drawing Sheets

Production Process Diagram (Part 1)

Production Process Diagram (Part 2)

Production Process Diagram (Part 3)

Production Process Diagram (Part 4)

US 7,560,754 B2

CMOS SOLID-STATE IMAGING DEVICE AND METHOD OF MANUFACTURING THE SAME AS WELL AS DRIVE METHOD OF CMOS SOLID-STATE IMAGING DEVICE

CROSS PREFERENCE TO RELATED APPLICATIONS

The present invention claims the benefit of Japanese Patent Application JP P2004-275461 filed in the Japanese Patent Office on Sep. 22, 2004, the entire contents of which are incorporated herein by reference.

FIELD OF THE INVENTION

The present invention relates to a CMOS solid-state imaging device, a method of manufacturing the same, and a drive method of the CMOS solid-state imaging device.

BACKGROUND OF THE INVENTION

Generally, in the MOS type semiconductor device, LOCOS (local oxidization of silicon) isolation has been used as element isolation for a long time, and STI (shallow trench isolation) has been come to use in recent years due to the miniaturization thereof.

In the CMOS solid-state imaging device as well, the STI has been used for element isolation. A CMOS solid-state imaging device includes a pixel region and peripheral circuitry which drives the pixel and performs signal processing, and a miniaturization technology of the peripheral circuitry is also employed in the pixel region. In element isolation of pixels in the recent miniaturized CMOS solid-state imaging device as well, the same STI element isolation method as that for the periphery is used in general.

FIG. 9 schematically shows a structure seen from the upper surface of the relevant portion of a pixel region in a CMOS solid-state imaging device; and FIG. 10 shows the structure in cross-section of a photodiode (photoelectric conversion portion) and a transistor of a pixel according to conventional STI isolation. Note that FIG. 10 corresponds to the section of A-A line of FIG. 9.

In a CMOS solid-state imaging device, unit pixels 2 [2A, 2B, 2C and 2D] are formed, each of which includes a photodiode PD constituting a photoelectric conversion portion and a plurality of MOS transistors; and a pixel region 3 is formed of a plurality of unit pixels 2 being arranged in the form of a matrix. The unit pixel 2 includes, for example, one photodiode PD and four CMOS transistors, namely a readout transistor, a reset transistor, a selection transistor and an amplification transistor. In FIG. 9, only the photodiode PD, and a readout transistor Tr1, a reset transistor Tr2 and an amplification transistor Tr3 that are connected to the photodiode are shown as the unit pixel 2, and a selection transistor is omitted in order to simplify explanations. The readout transistor is formed of a charge-accumulation region of the photodiode PD, a source drain region 4 to be a floating diffusion (FD), and a transfer gate electrode 5 formed with a gate insulating layer in between. The reset transistor Tr2 is formed of a pair of source drain regions 4 and 6, and a reset gate electrode 7 formed with a gate insulating layer in between. The amplification transistor Tr3 is formed of source drain regions 6 and 8, and a gate electrode formed with a gate insulating layer in between. A vertical signal line 10 is connected to one source drain region 8 of the readout transistor Tr1 of each of the pixels vertically aligned, and a power line which supplies power supply voltage Vdd is connected to one source drain region 6 of the reset transistor Tr2. An element isolation region 8 separates the pixels 2 [2A, 2B, 2C and 2D].

In a CMOS solid-state imaging device 11, in accordance with conventional STI isolation, as shown in the cross-sectional structure of FIG. 10, a p-type semiconductor well region 13 is formed in an n-type silicon semiconductor substrate 12, a trench 14 is formed in the p-type semiconductor well region 13 and a silicon oxide film 15 is buried in the trench 14, and an element isolation region separating adjacent pixels 2, namely an STI region 81 (which corresponds to the element isolation region 8 in FIG. 9), is thus formed, for example. By the STI region 81, a photodiode PD of the pixel 2B on one side and a photodiode PD of the pixel 2A adjacent thereto are separated, and also a floating diffusion (FD) of a readout transistor Tr1 of the pixel 2B on one side and a source drain region 8 of an amplification transistor Tr3 of the pixel 2A on the other side are separated.

A photodiode PD is formed having an HAD (Hall Accumulated Diode) structure including what is called an n-type substrate 12, a p-type semiconductor well region 13, an n-type charge-accumulation region 18, and a p+ accumulation layer 19 at the interface between the n-type charge-accumulation region 18 and an insulating layer 20 on the surface side thereof. A readout transistor Tr1 includes a transfer gate electrode 5 formed between the n-type charge-accumulation region 18 of the photodiode PD and a source drain region 4 to be a floating diffusion (FD) with a gate insulating layer 20 in between. On the other hand, in the STI region 81, a p+ semiconductor region 17 for restraining dark current and white spots is formed at the interface between the silicon oxide film 15 deeply buried and the n-type charge-accumulation region 18 and also at the interface between the silicon oxide film 15 deeply buried and the p-type semiconductor well region 13.

On the other hand, a technology of an element isolation portion is proposed, in which in an MOS solid-state imaging device, an element isolation portion is formed of an insulating layer made on a semiconductor substrate so as not to corrode the semiconductor substrate.

There are mainly two problems with respect to a CMOS solid-state imaging device using the above-described STI element isolation method as a pixel region isolation technology.

Since the deep trench 14 is formed in the silicon substrates (12 and 13) and the silicon oxide film 15 is buried therein to form an element isolation region 81, the STI element isolation method is excellent in forming a miniaturized element isolation region. However, due to a difference in thermal expansion coefficient between the silicon oxide film 15 deeply buried and the silicon substrates (12 and 13) and other factors, there is a first problem in which pixel defects caused by thermal stress easily occur. Therefore, the form of STI is designed to be a tapered-shape and other devices are contrived. However, to make the form of STI tapered results in narrowing the region of photodiodes PD, leading to reduction in the saturation signal amount and sensitivity.

A second problem is the existence of the p+ semiconductor region 17 at the interface between the silicon oxide film 15 within the trench 14 and the photodiode PD. In the photodiode PD, that is, an HAD sensor, the n-type charge-accumulation region 18 is depleted, however, a boundary with the silicon oxide film 15 needs to be covered with the p+ semiconductor region 17 made of a diffusion layer, in order to restrain dark current and white spots caused by the occurrence of a small number of current carriers from an interface level. Therefore, the interface of the silicon oxide film 15 of the STI region 81 needs to be covered with the p+ semiconductor region 17 having a similar concentration to the p+ accumulation layer 19 of the HAD sensor. To three-dimensionally cover the portion in the depth direction with a sufficient concentration is not easy from the viewpoint of production thereof. For example, it is difficult to introduce a p-type impurity to form the p+ semiconductor region 17 into the trench side surface of the STI region 81 by portion of ion implantation. Specifically, since an impurity is introduced into a narrow place (trench side surface) by portion of diagonal ion implantation, the ion implantation is difficult to be performed. Further, since the p+ semiconductor region 17 is introduced in an earlier process, there is a problem in which the p+ semiconductor region 17 enlarges a great deal toward the side of a photosensor (photodiode PD) due to thermal diffusion, narrowing the photosensor. Even if reduction in thermal treatment is possible, there is still a fundamental problem in which the region of the n-type charge-accumulation region 18 of the photosensor decreases as shown in FIG. 10 and so the saturation signal amount decreases, for the reason that the trench side of the STI region 81 needs to be covered with the concentrated p+ semiconductor region 17 in principle.

With element isolation by the STI region 81 based on a conventional miniaturization technology, minute isolation can be obtained as an isolation method for a simple MOS transistor; however, with respect to the isolation between pixels of the CMOS solid-state imaging device, there remain the above-described two problems, causing deterioration in images and making it difficult for miniaturized pixels to be manufactured.

SUMMARY OF THE INVENTION

In light of the above-described problems, the present invention provides a CMOS solid-state imaging device, in which the occurrence of white spots and dark current caused by pixel defects is restrained and the saturation signal amount increases in comparison with conventional devices; and a manufacturing method thereof.

Specifically, the present invention solves a problem, in which the above-described STI isolation method employed for miniaturization requires a surface pinning layer (what is called a p-type semiconductor region) for restraining dark current on interfaces and the practical size of the sensor area cannot be made large; and provides a CMOS solid-state imaging device in which a larger saturation signal amount can be obtained by a pixel size of the same area and the occurrence of dark current can be reduced. In particular, a technology is provided with which the saturation signal amount may increase by enlarging sensor regions with respect to isolation regions between photodiodes and between a photodiode and a transistor that occupy large areas in isolation regions.

Further, the present invention provides a drive method of a CMOS solid-state imaging device, which prevents unnecessary charges from flowing into a photoelectric conversion portion (photodiode) during the charge accumulation period.

In the present invention, there is provided a CMOS solid-state imaging device comprising: a plurality of pixels each of which includes a photoelectric conversion portion and a transistor, wherein an element isolation portion within each of said plurality of pixels is formed of a diffusion layer.

Also, there is provided a CMOS solid-state imaging device comprising: a plurality of pixels each of which includes a photoelectric conversion portion, wherein adjacent ones of said plurality of pixels are separated by an element isolation portion formed of a diffusion layer and an insulating layer thereon.

In the present invention, there is provided a CMOS solid-state imaging device comprising: a plurality of pixels each of which includes a photoelectric conversion portion, wherein said photoelectric conversion element in a first pixel included in said plurality of pixels and a source/drain region of a transistor in a second pixel adjacent to said first pixel are separated from each other by an element isolation portion formed of a diffusion layer and an insulating layer thereon and wherein said source/drain region is formed apart from said diffusion layer.

Also, there is provided a CMOS solid-state imaging device comprising: a plurality of pixels each of which includes a photoelectric conversion portion, wherein said photoelectric conversion element in a first pixel included in said plurality of pixels and a source/drain region of a transistor in a second pixel adjacent to said first pixel are separated from each other by an element isolation portion formed of a diffusion layer and an insulating layer thereon and wherein said source/drain region is formed apart from said diffusion layer.

In the present invention, there is provided a method of manufacturing a CMOS solid-state imaging device in which adjacent pixels are separated by element isolation portion formed of a diffusion layer and an insulating layer thereon comprising the processes of: depositing a silicon nitride film on a substrate and forming an opening in a portion of said silicon nitride film where element isolation should be formed; forming a silicon oxide film within said opening; and removing said silicon nitride film and forming an insulating layer of said element isolation portion using said silicon oxide film whose surface protrudes from said substrate surface.

Also, there is provided a method of driving a CMOS solid-state imaging device having a plurality of pixels, adjacent ones of which are separated by element isolation portion formed of a diffusion layer and an insulating layer thereon, wherein each of said plurality of pixels is driven where at least the electrical potential of a source drain region of a transistor of another pixel adjacent to a photoelectric conversion portion of a pixel with said element isolation portion in between is set to the potential not becoming 0V in a charge-accumulation period in which charges are accumulated in said photoelectric conversion portion.

BRIEF DESCRIPTION OF THE DRAWINGS

FIG. 4B is a comparative diagram of a surface potential distribution in a photodiode and a source drain region of a transistor of an adjacent pixel with an element isolation region in between;

FIG. 4C is a surface potential distribution diagram according to the embodiment in a photodiode and a source drain region of a transistor of an adjacent pixel with an element isolation region in between;

DESCRIPTION OF THE PREFERRED EMBODIMENTS

A CMOS solid-state imaging device according to an embodiment of the present invention is characterized in that: in a pixel region where at least a plurality of pixels are arranged, element isolation within a pixel and element isolation between pixels next to each other are executed by a diffusion layer; further preferably, the element isolation is executed by element isolation portion which includes the diffusion layer and an insulating layer thereon. Specifically, element isolation between photodiodes is executed by element isolation portion including an isolation insulating layer in a position shallower than the position of a silicon oxide film in a conventional STI region and a required conductive type diffusion layer provided under the isolation insulating layer, preferably a required conductive type diffusion layer having concentration equal to or higher than an accumulation layer of an HAD sensor. Hereupon, the bottom (so called a lower surface) of the isolation insulating layer is in a position equal to or shallower than a pn junction position on the side of the accumulation layer of the HAD sensor. With this structure, a charge-accumulation region of a photosensor can easily extend under the isolation insulating layer, so that the practical area of a charge-accumulation region of a photosensor is made larger than before, and the saturation signal charge amount can be increased without increasing white spots or dark current. The element isolation portion according to this embodiment is also applied between a photodiode and a source drain region of a transistor, which makes it possible to enlarge the area of a charge-accumulation region of a photosensor as well.

Hereinafter, embodiments of the present invention are explained, referring to the figures.

Figure 1:
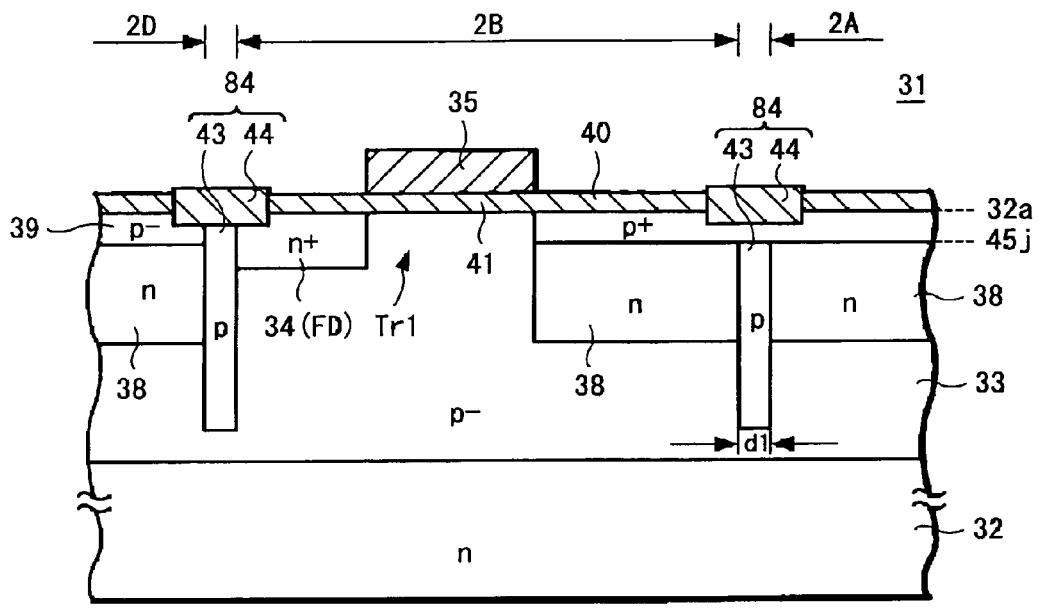
FIG. 1 is a structural view of a relevant part showing a first embodiment of a CMOS solid-state imaging device according to the present invention.

FIG. 1 shows a first embodiment of a CMOS solid-state imaging device according to the present invention. FIG. 1 shows a cross-sectional structure corresponding to the B-B line in the pixel region of FIG. 9.

In a CMOS solid-state imaging device 31 according to the first embodiment, a second conductive type, for example p-type, semiconductor well region 33 is formed in a first conductive type, for example n-type, silicon semiconductor substrate 32; a plurality of unit pixels 2, each of which includes a photodiode PD that is a photoelectric conversion portion and a plurality of MOS transistors, are formed in the p-type semiconductor well region 33; and an element isolation region 84, which is element isolation portion according to the present invention, (corresponding to the element isolation region 8 in FIG. 9) is formed between unit pixels 2 next to each other, and also within each unit pixel. In FIG. 1, in the p-type semiconductor well region 33 are formed: a photodiode PD and a transfer transistor Tr1 constituting the pixel 2B, a photodiode PD constituting the pixel 2A, a photodiode PD constituting the pixel 2D, and element isolation regions 84 which is provided to separate the pixels 2B, 2A and 2D.

As described above, each photodiode PD forms an HAD type sensor including a second conductive type p+ accumulation layer 39, provided at the interface with an insulating layer 40 on the surface of the silicon substrate, and a first conductive type n-type charge-accumulation region 38 thereunder which accumulates signal charges obtained through photoelectric conversion. The p+ accumulation layer 39 is formed, for example, of a concentrated p-type diffusion layer which is $5 \times 10^{17}$ cm$^{-3}$ or more in concentration. The n-type charge-accumulation region 38 is formed, for example, by portion of ion implantation whose dose amount is $1 \times 10^{12}$ cm$^{-2}$ or so.

Figure 9:
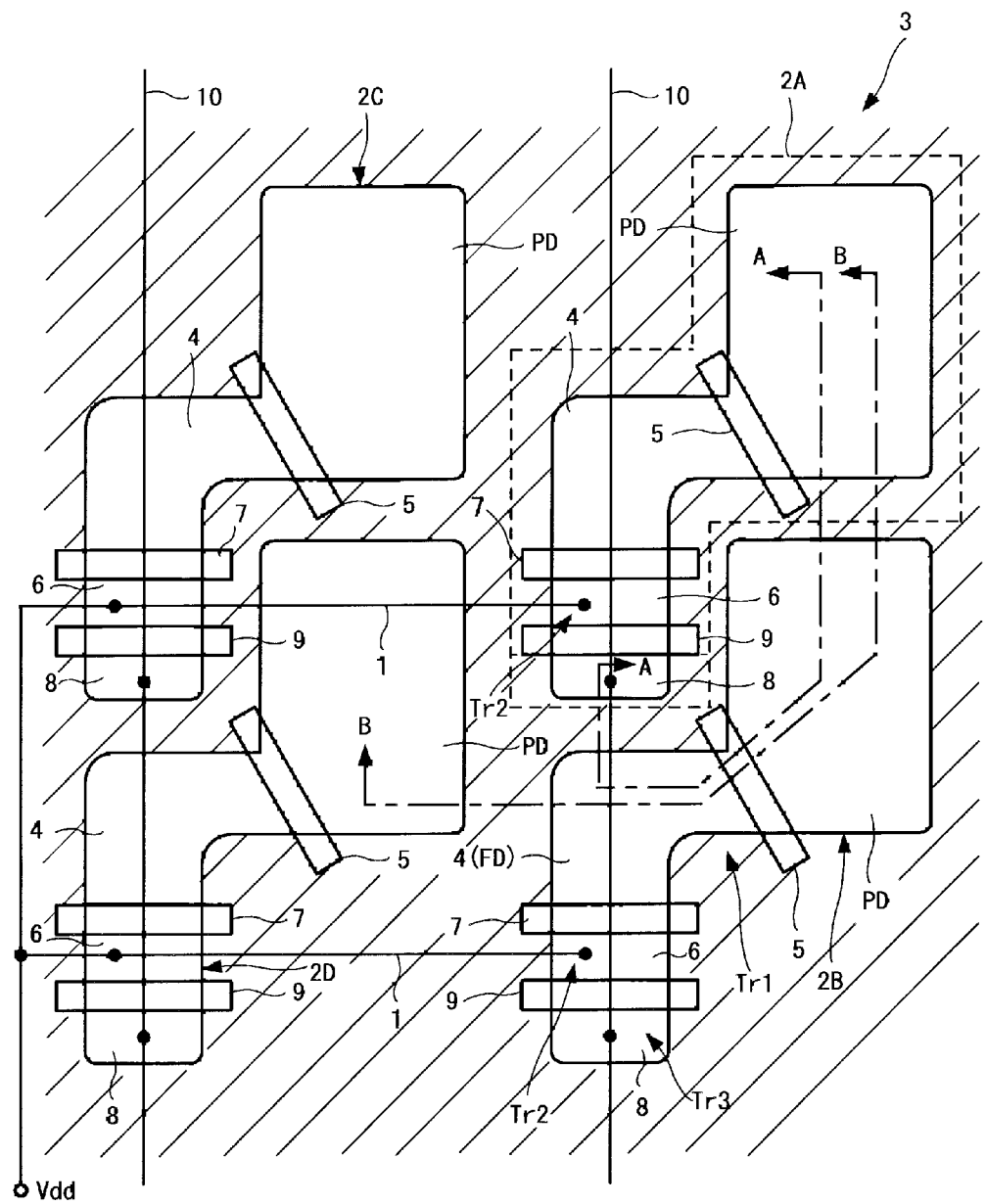
FIG. 9 is a schematic top view of an example of a pixel region of a CMOS solid-state imaging device.
Figure 10:
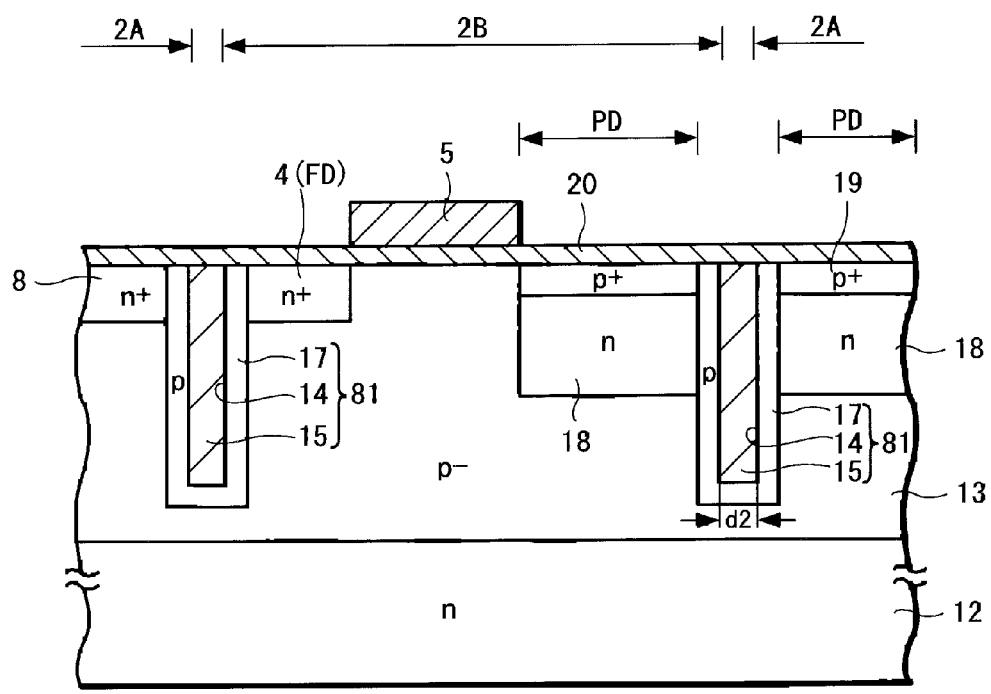
FIG. 10 is a cross-sectional view (the A-A line in FIG. 9) of the relevant part of a CMOS solid-state imaging device of a conventional example 1.

The transfer transistor Tr1 is formed of an n-type source drain region 34 to be a floating diffusion (FD), (corresponding to the region 4 (FD) in FIG. 9), the n-type charge-accumulation region 38 of the photodiode PD, and a transfer gate electrode 35 (corresponding to the transfer gate electrode 5 in FIG. 9) formed between the above two regions with a gate insulating layer 40 in between, which is made of a polycrystalline silicon film, for example.

The element isolation region 84 includes a p-type isolation diffusion layer 43 formed in the p-type semiconductor well region 33 by portion of ion implantation, and an isolation insulating layer formed thereon, that is, an isolation oxide film (SiO$_2$ film) 44 in this embodiment. The isolation oxide film 44 is formed to make the bottom thereof exist in a position much shallower than before. The bottom of the isolation oxide film 44 is formed in a shallower position than the position 45j of a pn junction that is formed between the n-type charge-accumulation region 38 and the p+ accumulation layer 39, that is, in a position between the pn junction position 45j and a silicon substrate surface 32a in this embodiment. Thus, at least with respect to the element isolation region 84 between pixels 2, under this isolation oxide film 44 as well, an interface level is covered with the p+ accumulation layer 39 which continues from the photodiode PD.

The p+ accumulation layer 39 which continuously extends under the isolation oxide film 44 has a function of controlling causes of dark current and white spots due to the interface level. Since the isolation oxide film 44 is a considerably shallow oxide film, pixel defects caused by thermal stress are not generated. The p-type isolation diffusion layer 43 also executes isolation in the width direction between photodiodes PD next to each other. On this occasion, the p-type isolation diffusion layer 43 may be formed by performing ion implantation a plurality of times in the depth direction.

On the other hand, in order to increase the saturation signal amount (what is called a signal charge amount), the n-type charge-accumulation region 38 in the photodiode PD is formed to exist under the isolation oxide film 44 and to extend horizontally in contact with the p-type isolation diffusion layer 43. For this reason, the width d1 of the p-type isolation diffusion layer 43 is made as small as possible in accordance with the allowable limit of the processing line width. The width d1 of the p-type isolation diffusion layer 43 can be 0.05

μm or more and 10 μm or less. In addition, the isolation width d1 of the p-type isolation diffusion layer 43 can be similar to the width d2 of the trench 14 of the above described STI region 81. Since the dose amount of the ion implantation of the n-type charge-accumulation region 38 is $1 \times 10^{12}$ cm$^{-2}$ or so, the p-type isolation diffusion layer 43 can be formed with a similar dose amount to that.

With respect to isolation by the element isolation region 84 between the photodiode PD of the pixel 2D and the source drain region 34, which is a floating diffusion (FD), of the readout transistor Tr1 of the pixel 2B, the photodiode PD side can be constructed in the same manner as described above. Specifically, the p+ accumulation layer 39 extends under the isolation oxide film 44. With respect to the floating diffusion (FD) side, the p+ accumulation layer 39 may be formed under and at the side of the isolation oxide film 44, or may be not formed.

According to the CMOS solid-state imaging device 31 of the first embodiment, the element isolation region 82 is formed of the p-type isolation diffusion layer 43 and the isolation oxide film 44 thereon. Practical isolation between the photodiodes PD of the pixels 2 next to each other, between the photodiode PD and the source drain region 34 of the MOS transistor of the pixels 2 next to each other, and between the source drain regions of the MOS transistors of the pixels 2 next to each other is executed by the p-type isolation diffusion layer 43. Further, since the isolation oxide film 44 is provided, even if a gate electrode or wiring extends onto (rides onto) this isolation oxide film 44, depletion or a parasitic channel layer such as an inverted layer is prevented from being induced immediately under the isolation oxide film 44, so that reliable isolation can be obtained between pixels.

Further, by forming the n-type charge-accumulation region 38 of the photodiode PD to exist under the isolation oxide film 44 and to be in contact with the p-type isolation diffusion layer 43, it is possible to enlarge the area of the n-type charge-accumulation region, and to greatly increase the saturation signal amount compared with a conventional STI isolation method. Further, since the isolation oxide film 44 is formed such that the bottom thereof is in a position shallower than the pn junction position 45j on the side of the p+ accumulation layer 39 and the p+ accumulation layer 39 is formed extending under the isolation oxide film 44 on the photodiode PD side, it is possible to restrain dark current and white spots. Therefore, the practical aperture of the photodiode PD can be increased without increasing dark current and white spots, and the saturation signal amount can be increased greatly.

The isolation oxide film 44 may be formed or may not be formed in a position deeper than the surface of the silicon substrate. In the case that the isolation oxide film 44 is made of a thin oxide film, the impurity concentration of the p-type region immediately under the isolation oxide film 44 is increased. This makes it possible to prevent a parasitic channel from being generated immediately under the isolation oxide film 44, even if the isolation oxide film 4 is made thin. Although having some relation with the surface concentration of the p-type region immediately under the isolation oxide film 44, the film thickness of the isolation oxide film 44 can be 1 nm or more and 1000 nm or less.

Figure 11A:
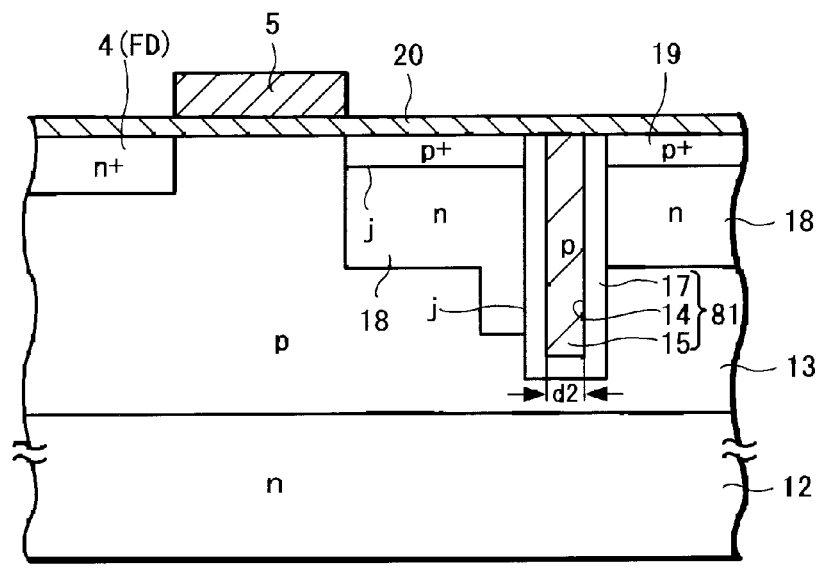
FIG. 11A is a cross-sectional view of a relevant part showing a reference example of a CMOS solid-state imaging device.
Figure 11B:
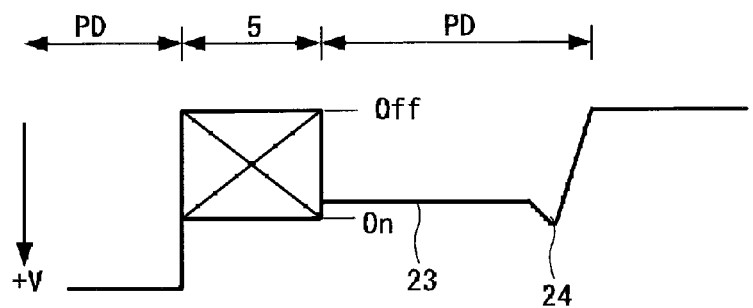
FIG. 11B illustrates is a surface potential distribution diagram for the CMOS solid-state imaging device of FIG. 11A.

Hereupon, other than the above-described one, a reason that the depth of the bottom of the isolation oxide film 44 is close to the pn junction position 45j is explained. As shown in FIG. 11A, in the case of a conventional STI isolation method, if an n-type charge-accumulation region 18 is extended in the depth direction along the side of an STI region 81, in other words, if an pn junction is extended in the depth direction, apparently the capacity of the n-type charge-accumulation region 18 increases, and signal charges increase to be accumulated. However, it is necessary particularly for a photodiode PD of an HAD structure to completely read out a great amount of signal charges which have been accumulated. As shown in FIG. 11B, however, there is a deeper potential dip 24 generated along the STI region 18 in an electrical potential distribution 23 within an HAD sensor due to a three-dimensional effect, so that some signal charges remain unread. Therefore, with respect to a pn junction j of the HAD sensor, signal charges can be read out easily when extended to the edge of an element isolation region as horizontally as possible.

In the first embodiment, since a pn junction of an HAD sensor can be formed horizontally extending to the edge of an element isolation region 82, the saturation signal charge amount increases without any disadvantage and the signal charges can completely be read out without any of them remaining unread.

Figure 2:
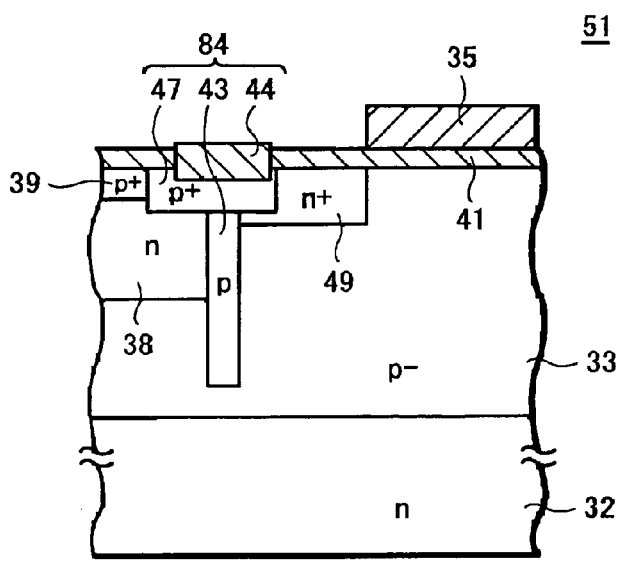
FIG. 2 is a structural view of a relevant part showing a second embodiment of a CMOS solid-state imaging device according to the present invention.

Next, FIG. 2 shows a second embodiment of a CMOS solid-state imaging device according to the present invention. FIG. 2 shows the cross-sectional structure of the relevant part of a pixel region similar to the above described embodiment, and portions corresponding to those in FIG. 1 are given the same numerals and redundant explanations are omitted.

In a CMOS solid-state imaging device 51 according to the second embodiment, an element isolation region 84 (corresponding to the element isolation region 8 in FIG. 9) which isolates a floating diffusion (FD) and the other MOS transistor source drain region 49 from a photodiode PD of an adjacent pixel is formed of a first p-type isolation diffusion layer 43, a second p-type isolation diffusion layer 47 thereon, and an isolation oxide film 44 further thereon. The second isolation diffusion layer 47 is made to have impurity concentration equal to or higher than that of a p+ accumulation layer 39. With respect to other structures than that, detailed explanation will be omitted on the grounds that they are similar to the embodiment in the above described FIG. 1.

According to the CMOS solid-state imaging device 51 of the second embodiment, since the second p-type isolation diffusion layer 47 is provided, isolation capability can further be improved. Specifically, in an element isolation region between the floating diffusion (FD) and the other MOS transistor source drain region 49 and the photodiode PD, a gate electrode 48 rides onto the isolation oxide film 44. Thus, if the first p-type isolation diffusion layer 43 is alone in an area where the p+ accumulation layer 39 does not exist, the surface of the first p-type isolation diffusion layer 43 tends to be inverted because of the electrical potential of the gate electrode 48, so that electrical charges can easily leak into the photodiode PD. However, in this embodiment, since the second p-type isolation diffusion layer 47 having high concentration is formed under the isolation oxide film 44 at least at the portion where an electrical potential inverting the surface is applied, the occurrence of an inverted layer is prevented and isolation capability is improved. Furthermore, without increasing dark current or white spots, the practical area of photodiodes PD is enlarged, so that the saturation signal amount can be increased greatly, which is the similar effectiveness to the first embodiment.

Note that the effectiveness with which an inverted layer is prevented can also be attained by forming a thick isolation oxide film 44, for example; however, there is a disadvantage of difficulty in processing the isolation oxide film. In the second embodiment, the isolation oxide film 44 can be formed relatively thin to be processed easily.

Figure 3:
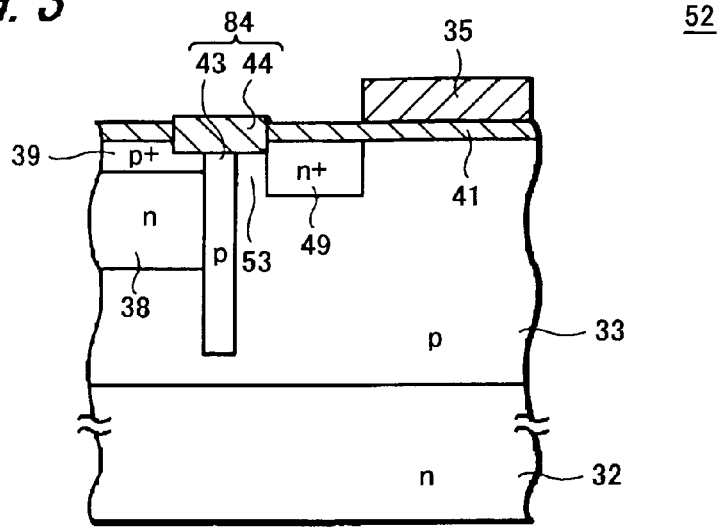
FIG. 3 is a structural view of a relevant part showing a third embodiment of a CMOS solid-state imaging device according to the present invention.

FIG. 3 shows a third embodiment of a CMOS solid-state imaging device according to the present invention. FIG. 3 shows the cross-sectional structure of the relevant part of a pixel region similar to the above described embodiment, and portions corresponding to those in FIG. 1 are given the same numerals and redundant explanations are omitted.

In a CMOS solid-state imaging device 52 according to the third embodiment, an element isolation region 84 (corresponding to the element isolation region 8 in FIG. 8) formed of a p-type isolation diffusion layer 43 and an isolation oxide film 44 thereon is formed between a floating diffusion (FD) and the other MOS transistor source drain region 49 and a photodiode PD of an adjacent pixel.

In this embodiment, particularly in the case that the impurity concentration of the floating diffusion (FD) and the other MOS transistor source drain region 49 and the p-type isolation diffusion layer 43 of the element isolation region is high, a separation region 53 is formed such that the source drain region 34 becomes apart from the p-type isolation diffusion layer 43 by a required distance in the element isolation region 84 where a gate electrode does not ride onto at least the isolation oxide film 44. In other words, the separation region 53 is formed such that a p-type semiconductor well region 33 exists between the source drain region 49 and the p-type isolation diffusion layer 43.

In this structure, in the case where the isolation oxide film 44 is thick, it is possible to form a self-aligned source drain region 39 with the isolation oxide film 44 as a mask. In the case where the isolation oxide film 44 is thin, it is possible to form a source drain region 39 with a resist mask in between.

Since other structures than the above are similar to the embodiment in the above described FIG. 1, detailed explanations thereof will be omitted.

According to the CMOS solid-state imaging device 52 of the third embodiment, since the separation region 53 is provided between the source drain region 49 and the element isolation region 84, even if the source drain region 49 and the p-type isolation diffusion layer 43 are high in concentration, it is possible to prevent the junction electric field of the source drain region 9 from becoming high. Furthermore, without increasing dark current or white spots, the practical area of photodiodes PD is enlarged, so that the saturation signal amount can be increased greatly, which is the similar effectiveness to the first embodiment.

The isolation insulating layer 44 is formed of a silicon oxide film in the above embodiment; other than that, the isolation insulating layer 44 can also be formed of an insulating layer containing a silicon oxide film and a silicon nitride film.

As another embodiment of the present invention, although not shown in the figures, the surface concentration of a p-type isolation diffusion layer 43 immediately under an isolation oxide film 44 of an element isolation region can be equal to or higher than the concentration of a p+ accumulation layer 39, and the concentration of the p-type isolation diffusion layer 43 can be gradually lowered in the depth direction. In particular, except for the surface, it is possible for the portion of the p-type isolation diffusion layer 43, which corresponds to the isolation portion with an n-type charge-accumulation region 38 to be the highest in concentration.

By gradually lowering the concentration of the p-type isolation diffusion layer 43 in the depth direction, horizontal diffusion of the p-type isolation diffusion layer 43 can be controlled, and so decrease in the area of photodiodes can be prevented.

Next, a fourth embodiment of a CMOS solid-state imaging device according to the present invention is explained.

Figure 4A:
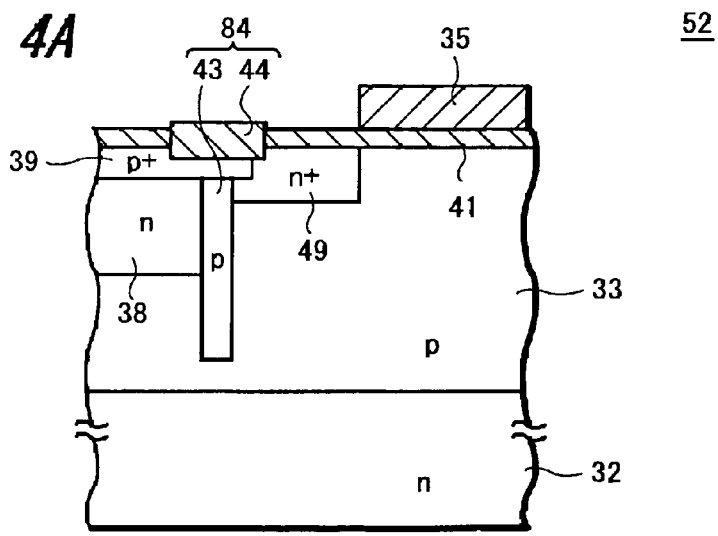
FIG. 4A is a structural view of a relevant part showing a fourth embodiment of a CMOS solid-state imaging device according to the present invention.

In an element isolation region of this embodiment, the concentration of an isolation oxide film 44 and a p-type isolation diffusion layer 43 thereunder that are necessary for element isolation is decided at the part where a gate electrode within a pixel rides onto the isolation oxide film 44. FIG. 4A shows the cross-sectional structure of the relevant part of a CMOS solid-state imaging device according to the fourth embodiment. In this embodiment, a photodiode PD and an MOS transistor of a pixel adjacent thereto are separated by an element isolation region 85 (corresponding to the element isolation region 8 in FIG. 9) formed of the above described p-type isolation diffusion layer 43 and isolation oxide film 44 thereon. Specifically, an n-type charge-accumulation region 38 is in contact with the p-type isolation diffusion layer 38 to exist under the isolation oxide film 44, and an n-type source drain region 49 is in contact with the p-type isolation diffusion layer 38. In this case, a p+ accumulation layer 39 of the photodiode PD is formed extending under the isolation oxide film 44. The MOS transistor is formed of a pair of source drain region and a gate electrode on a gate insulating layer. Further, the gate electrode rides onto the isolation oxide film 44.

Since other structures are similar to those in FIG. 1, the same numerals are given and explanations thereof will be omitted.

In the element isolation region 85, if the isolation oxide film 44 is made thicker, and the concentration of the p-type isolation diffusion layer 43 is made higher, isolation characteristics become improved. In this case, however, the isolation oxide film 44 becomes difficult to form, and the gate electrode becomes difficult to process. If the concentration of the p-type isolation diffusion layer 43 is high, there is a possibility that the n-type charge-accumulation region 38 is corroded by the diffusion of a p-type impurity, and so the saturation signal amount decreases.

Accordingly, in this embodiment, an element isolation region 85 in which the isolation oxide film 44 is made thin and the concentration of the p-type isolation diffusion layer 43 is lowered is formed; and there is provided a condition set for driving a pixel of a CMOS solid-state imaging device, in which during the charge-accumulation period of accumulating charges in a photoelectric conversion portion of a pixel, the electrical potential of a source drain region of an MOS transistor of another pixel adjacent to the photoelectric conversion portion of this pixel accumulating charges with the element isolation region in between, does not become 0V. For example, a voltage applied to the source drain region is made different from 0V. The film thickness of the isolation oxide film 44 can be selected 1 nm or more and 1000 nm or less. Specifically, the isolation oxide film 44 should have such a film thickness as does not allow an electrical current to flow into the isolation oxide film due to a difference in electrical potential between a polysilicon electrode and a substrate. The thickness of the oxide film should be large so as to be below 5 MV/cm in normal electric field strength. Given 2.5V, the film thickness can be 5 nm or so.

Figure 4B:
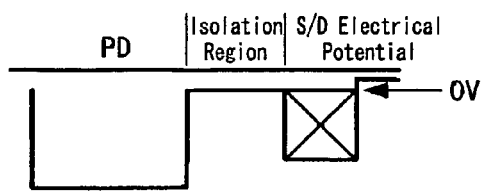

FIG. 4B shows a potential distribution when the source drain region has become 0V for some reason. Since a ground potential is applied to the p-type isolation diffusion layer 43, the potential immediately under the element isolation region becomes 0V. For this reason, if depletion or an inverted layer is induced immediately under the isolation oxide film due to the electrical potential of the gate electrode placed on the isolation oxide film, there is a possibility that electrons (electrical charges) will flow from the source drain region into the n-type charge-accumulation region of the photodiode PD which is accumulating charges. In the CMOS solid-state imaging device whose source drain region becomes 0V in electrical potential, it is necessary to enlarge the film thickness of the isolation oxide film of the element isolation region, to raise the concentration of the p-type isolation diffusion layer 43, and so depletion or an inverted layer can be prevented from being induced. Hereupon, an example of the case in which the source drain region becomes 0V is explained. For example, the amplification transistor Tr3 shown in FIG. 9 is charged in advance for resetting the vertical signal line, before reading out or resetting electrical charges. On that occasion, the vertical signal line 10 is lowered to a ground (GND) level, and the source drain region 8 that is connected to the vertical signal line 10 becomes 0V.

Figure 4C:
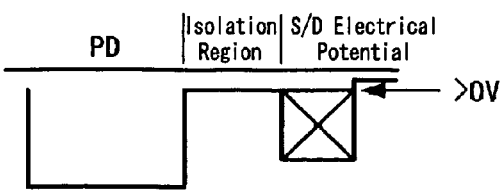

On the other hand, FIG. 4C shows a potential distribution of this embodiment. The electrical potential of the source drain region is set higher than 0V; for example, such an electrical potential as approximately +0.2 to 0.3V or 0.a few V is a plus electrical potential. Since a ground potential is applied to the p-type isolation diffusion layer 43, the potential immediately under the element isolation region becomes 0V. Since there is such a potential distribution with which a potential barrier immediately under the element isolation region to be formed in this manner, even if depletion or an inverted layer is induced in a silicon region immediately under the isolation oxide film due to the electrical potential of the gate electrode provided on the isolation oxide film, electrons (electrical charges) are prevented from leaking from a source drain region of a transistor of an adjacent pixel into the n-type charge-accumulation region in the charge-accumulation period of the n-type charge-accumulation region 38. Therefore, the isolation oxide film of the element isolation region can be made thin, and the concentration of the p-type isolation diffusion layer can be lowered. For example, if the voltage of the source drain region is 0.5V, isolation is possible with the film thickness of the isolation oxide film 44 being 50 nm and the concentration of the p-type isolation diffusion layer 43 being $1 \times 10^{13}$ cm$^{-2}$. Under this condition, there is no problem particularly in the processing of the isolation oxide film 44, and the junction electric field of the source drain region is weak. Further, since it is possible to lower the concentration of the p-type isolation diffusion layer, the n-type charge-accumulation region is not corroded by the diffusion of an impurity, and increase in the saturation signal amount can be maintained.

Next, an embodiment of a method of manufacturing a CMOS solid-state imaging device according to the present invention is explained, using FIGS. 5 to 8. For simplification, those figures show regions with respect to isolation between photodiodes and isolation between a photodiode and a source drain region.

Figure 5A:
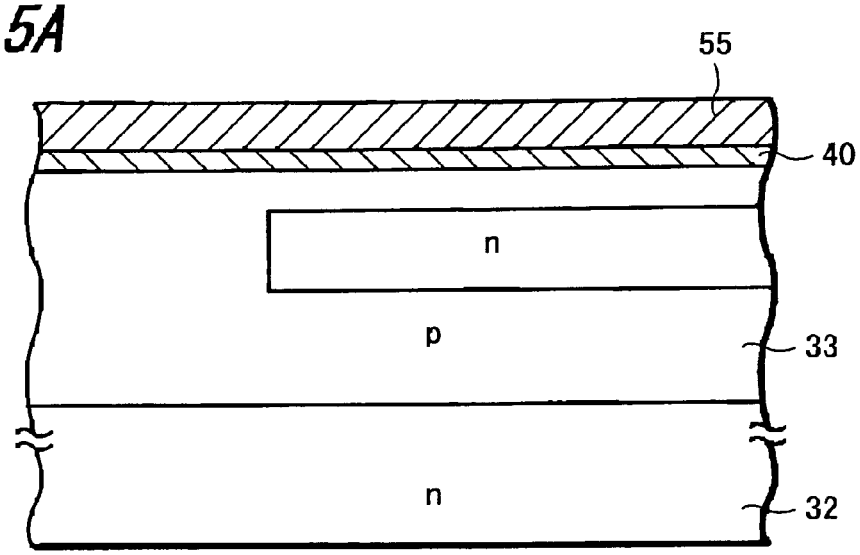
FIG. 5 is A and B Production process diagrams (part 1) showing an embodiment of a method of manufacturing a CMOS solid-state imaging device according to the present invention.

First, as shown in FIG. 5A, a silicon substrate 30 in which a second conductive type, for example p-type, semiconductor well region 33 is formed on a first conductive type, for example n-type, silicon substrate 32 is provided. After a silicon oxide film 40 is formed on the surface of the silicon substrate 30 and a silicon nitride film 55 is grown thereon, an n-type charge-accumulation region 38 is formed in an region to be a photodiode, for example with a resist mask (not shown in the figure) in between, by portion of ion implantation. For example, the n-type charge-accumulation region 38 is formed by performing ion implantation of an n-type impurity by dose amount of approximately $1 \times 10^{12}$ cm$^{-2}$. On this occasion, as the n-type impurity, As is excellent in controlling diffusion in thermal treatment, but phosphorus (P) can also be used. Further, when forming the n-type charge-accumulation region 38, since the part adjacent to the photodiode is made to be a p-type isolation region of an element isolation region by being inversed by a p-type impurity, the n-type charge-accumulation region can also be formed in a continuous pattern. In this embodiment, the n-type charge-accumulation region 38 is formed continuously with respect to pixels next to each other.

Figure 5B:
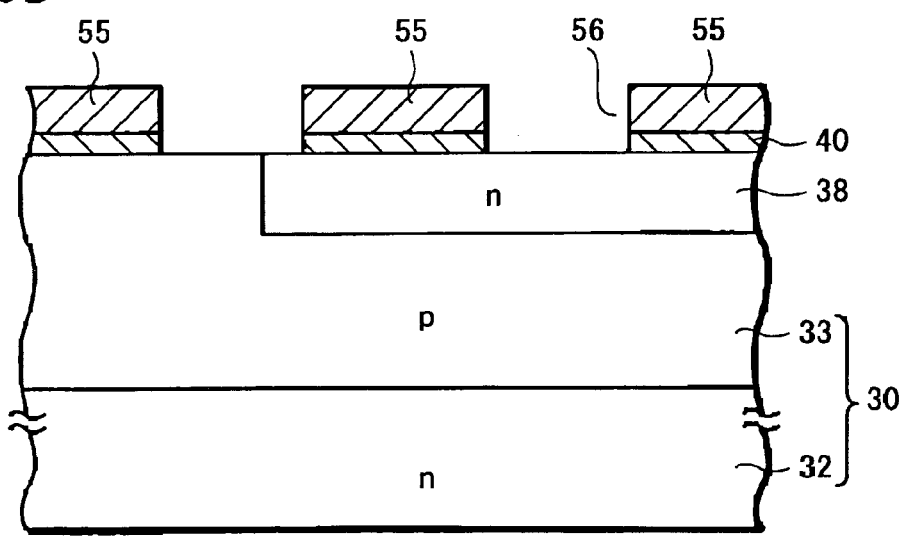

Next, as shown in FIG. 5B, the silicon nitride film 55 at the portion where an element isolation region should be formed, namely at the portion between photodiodes of pixels next to each other and at the portion between a photodiode and a source drain region of pixels next to each other is selectively removed by etching; subsequently, the silicon oxide film 40 thereunder is selectively removed by etching, forming an opening 56.

Figure 6C:
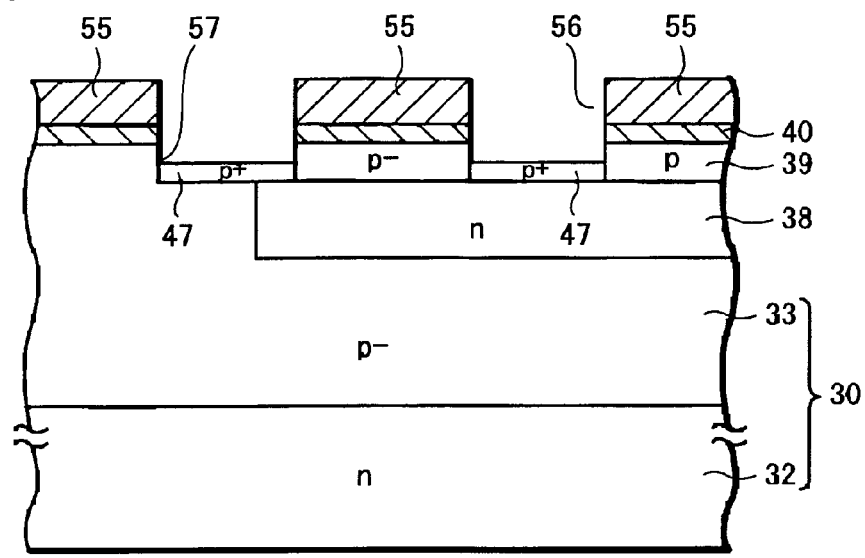
FIG. 6 is C and D Production process diagrams (part 2) showing an embodiment of a production method of a CMOS solid-state imaging device according to the present invention.

Next, as shown in FIG. 6C, a shallow groove 57 is made in the silicon substrate surface corresponding to the opening 56 by portion of shallow etching, with the silicon nitride film 55 and the silicon oxide film 450 serving as masks. On this occasion, the depth of the groove is made shallower than the depth of the pn junction in the above described HAD structure. Note that if in this case a required silicon oxide film can be made, the surface of the silicon substrate is not necessarily etched. Next, a second p-type isolation diffusion layer 47 for element isolation is formed at the bottom of the groove 57 by performing ion implantation of a p-type impurity. The second p-type isolation diffusion layer 47 is formed by ion implantation, with boron (B), dose amount of which is $2 \times 10^{12}$ cm$^{-2}$ to $1 \times 10^{14}$ cm$^{-2}$ and implanting energy of which is several KeV to 50 KeV, for example.

Figure 6D:
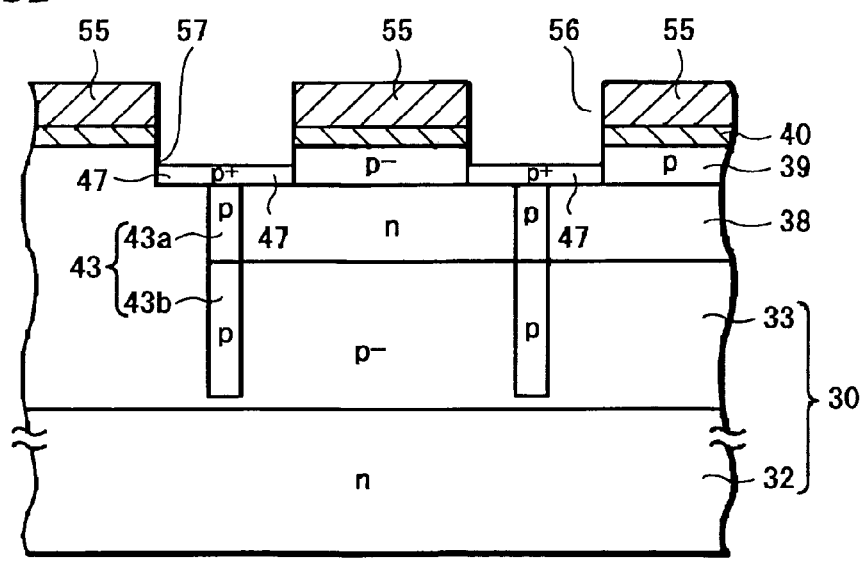

Next, as shown in FIG. 6D, under the second p-type isolation diffusion layer 47 is formed a first p-type isolation diffusion layer 43 [43a and 43b] which is narrower than the second p-type isolation diffusion layer 47, by portion of ion implantation. On this occasion, ion implantation is executed a plurality of times separately in the depth direction. In this example, ion implantation is executed twice separately in the depth direction, and the p-type isolation diffusion layer 43a, which is high in concentration, is formed in a shallower position, while the p-type isolation diffusion layer 43, which is low in concentration, is formed in a deeper position.

Figure 7E:
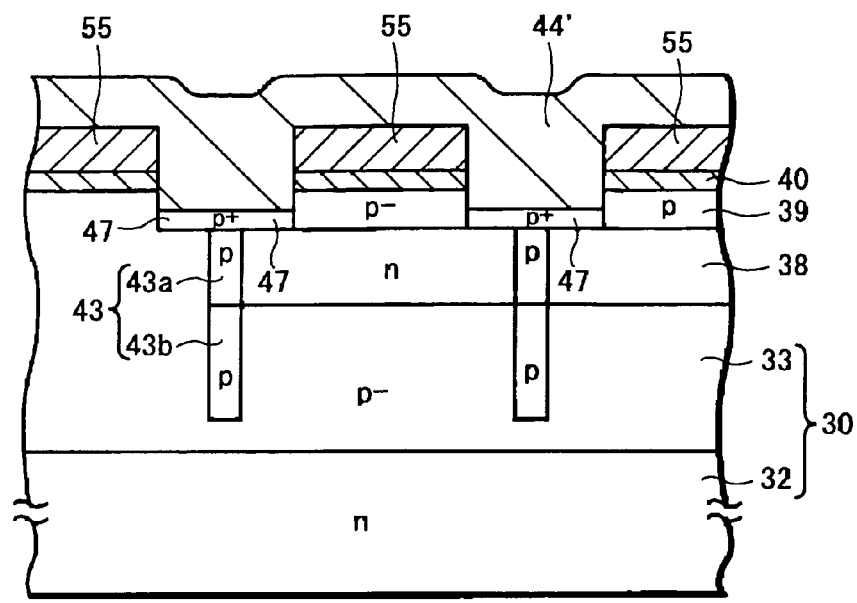
FIG. 7 is E and F Production process diagrams (part 3) showing an embodiment of a production method of a CMOS solid-state imaging device according to the present invention.

Next, as shown in FIG. 7E, a silicon oxide film 44' to be an isolation oxide film is formed on the whole surface to fill the groove 57 and the opening 56, by portion of the HDP-CVD (High Density Plasma Chemical Vapor Deposition) method, for example.

Figure 7F:
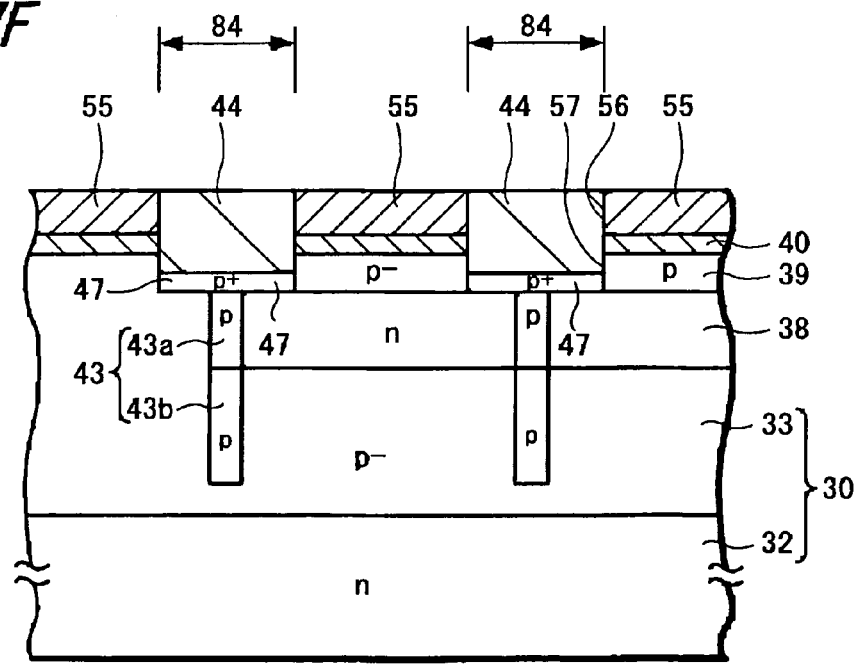

Next, as shown in FIG. 7F, the silicon oxide film 44' is planarized to the surface of the silicon nitride film 55 by portion of the CMP (Chemical Mechanical Polishing) method, for example, and an isolation oxide film 44 buried in the groove 57 and the opening 56 is left. The isolation oxide film 44, the second p-type isolation diffusion layer 47 and the first p-type isolation diffusion layer 43 [43a and 43b] constitute an element isolation region 84.

Figure 8:
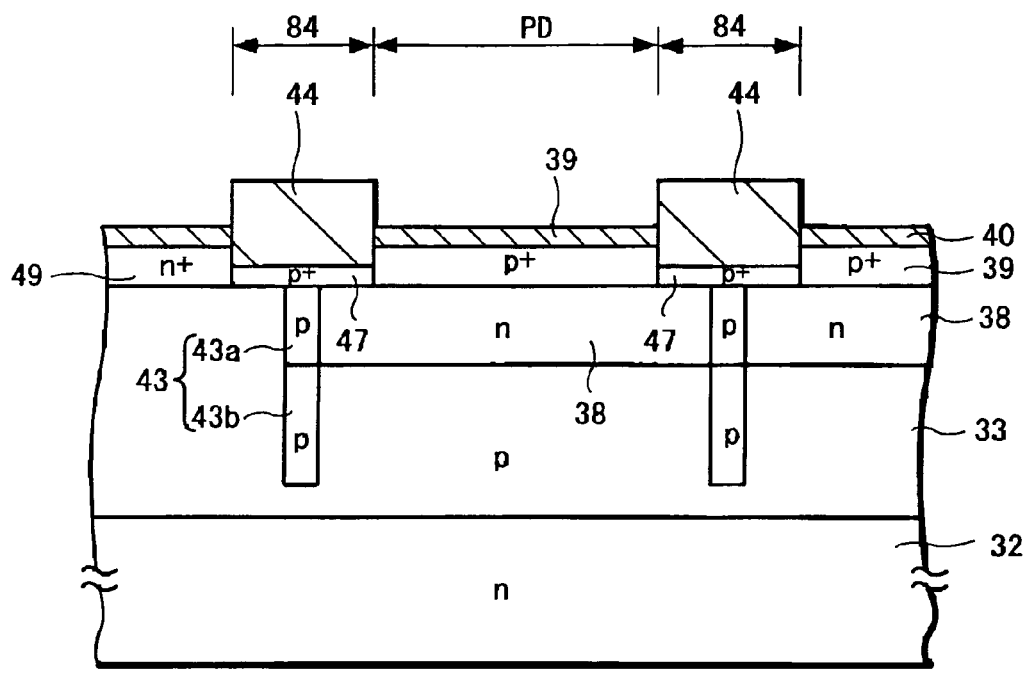
FIG. 8 is a production process diagram (part 4) showing an embodiment of a production method of a CMOS solid-state imaging device according to the present invention.

Next, as shown in FIG. 8, the silicon nitride film 55 is removed; after that, a source drain region 49 of an MOS transistor, and a p+ accumulation layer 39 of a photodiode are formed according to normal processes. The source drain region 49 can be positioned as deep as the p+ accumulation layer 39; alternatively, as in the case of the source drain region 34 of FIG. 1, the source drain region 49 can be positioned deeper than the p+ accumulation layer 39. The p+ accumulation layer 39, the n-type charge-accumulation region 38, the p-type semiconductor well region 33 and the n-type silicon substrate 32 constitute a photodiode PD of an HAD structure. After that, a gate insulating layer and a gate electrode are formed, and MOS transistors corresponding thereto respectively are formed. In FIG. 8, the source drain region 49 is formed as a part by portion of ion implantation with the isolation oxide film 44 serving as a mask. Thus, an object CMOS solid-state imaging device is obtained.

As another embodiment of the manufacturing method, after an opening 56 is formed in the silicon nitride film 55 and the silicon oxide film 40 in the process of FIG. 5B, without forming a groove in the silicon substrate surface, the silicon substrate surface is oxidized with the silicon nitride film 55 serving as a mask prior to ion implantation. With this process, a shallow groove 57 can be formed with less surface damage in the silicon substrate. With the surface oxide film left, after that, an intended CMOS solid-state imaging device can be manufactured in similar processes to the above-described embodiment.

According to a method of manufacturing a CMOS solid-state imaging device of the above-described embodiment, by burying the silicon oxide film 44' in the opening 56 of the silicon nitride film 55, removing the silicon nitride film 55 and then forming the isolation oxide film 44 of a silicon oxide film whose surface protrudes from the surface of the silicon substrate 30, it is possible to easily and accurately form the isolation oxide film 44 having a small area.

After forming the silicon oxide film 44' on the silicon nitride film 55 to fill the opening 56 in the processes of FIGS. 7E and 7F, the surface of the silicon nitride film 55 is planarized by the CMP method, so that it is possible to easily and accurately form the isolation oxide film 44 whose film thickness is controlled.

After forming the opening 56, the shallow groove 57 is formed by performing selective etching slightly on the silicon substrate surface facing the opening 56, and the silicon oxide film 44' is buried therein, the isolation oxide film 44 whose lower surface is below the silicon substrate surface can be formed.

By forming the high concentration p-type region 47 on the silicon substrate surface facing the opening 56 in the process of FIG. 6C, and forming the p-type isolation diffusion layer 43 [43a and 43b] by portion of ion implantation executed a plurality of times such that the concentration lowers in the depth direction in the process of FIG. 6D, it is possible to easily form the p-type isolation diffusion layer 43 in which the surface concentration is high and the concentration lowers in the direction of the substrate depth.

Since the n-type charge-accumulation region 38 is formed before the opening 56 and the silicon oxide film 44 are formed, it is possible to finally form the n-type charge-accumulation region 38 extending under the isolation oxide film 44 and in contact with the p-type isolation diffusion layer 43.

By oxidizing the silicon substrate surface with the silicon nitride film as a mask, before performing ion implantation of the p-type region 47 and of the p-type diffusion layers 43 and 343b is executed, it is possible to form the shallow silicon groove 57 with less surface damage.

In the embodiment above, the isolation oxide film 44 is formed after the shallow groove 57 is formed in the silicon substrate surface with the silicon nitride film 55 serving as a mask; other than that, as another embodiment, although not shown in the figures, without making the groove 57 in the silicon substrate 30 by portion of selective etching, it is possible to form the isolation oxide film 44 by locally oxidizing the silicon substrate surface facing the opening 56 with a nonoxidative film, for example the silicon nitride film 5, serving as a mask.

AS described above, according to a CMOS solid-state imaging device of the present invention, since element isolation portion within a pixel including a photoelectric conversion portion and transistors is formed of a diffusion layer, the width of the element isolation portion becomes the width of the diffusion layer alone, so that the area of the photoelectric conversion portion within the pixel is made large and the saturation signal amount in miniaturized pixels increases. A larger saturation signal amount can be obtained by a pixel size of the same region compared to the STI isolation method. Further, since element isolation portion is formed of a diffusion layer, the occurrence of white spots and dark current caused by pixel defects is restrained. Furthermore, since element isolation is executed only by a diffusion layer within a pixel, the production of element isolation portion is facilitated.

According to a CMOS solid-state imaging device of the present invention, adjacent pixels are separated by element isolation portion formed of a diffusion layer and an insulating layer thereon. Since element isolation between the pixels is virtually executed by the diffusion layer, the isolation width becomes the width of the diffusion layer alone, so that the area of photoelectric conversion portion within the pixel is made large and the saturation signal amount in miniaturized pixels increases. A larger saturation signal amount can be obtained by a pixel size of the same area compared with the STI isolation method. Further, since a diffusion layer is used, the occurrence of white spots and dark current caused by pixel defects is restrained.

Since an insulating layer is provided on the above-described diffusion layer, even if part of a gate electrode extends onto the insulating layer, depletion or an inverted layer is prevented from being induced immediately under the insulating layer, so that reliable isolation can be obtained between pixels. Since the insulating layer of the element isolation portion is formed in a position equal to the pn junction position on the accumulation layer side on the side of a photoelectric conversion portion or in a position shallower than the pn junction position, that is, the lower surface of the insulating layer is formed in a position equal to or shallower than the pn junction position, a photoelectric conversion portion can be formed under the insulating layer, and so the practical area of the photoelectric conversion portion can be increased.

According to a CMOS solid-state imaging device of the present invention, since adjacent pixels are separated by element isolation portion formed of a diffusion layer and an insulating layer thereon and a charge-accumulation region of a photoelectric conversion portion constituting a pixel is formed to extend under the above-described insulating layer, the practical area of the photoelectric conversion portion increases and the saturation signal amount in miniaturized pixels can be increased.

Further, as described above, a larger saturation signal amount can be obtained by a pixel size of the same area in comparison with the STI isolation method. The occurrence of white spots and dark current caused by pixel defects can be restrained. Since element isolation portion includes an insulating layer, even if part of a gate electrode extends onto the insulating layer, depletion or an inverted layer is prevented from being induced immediately under the insulating layer, so that reliable isolation can be obtained between pixels.

According to a CMOS solid-state imaging device of the present invention, since adjacent pixels are separated by element isolation portion formed of a diffusion layer and an insulating layer thereon and the insulating layer is formed in a position corresponding to the position between the surface of the semiconductor and a pn junction position of a photoelectric conversion portion, that is, the lower surface of the insulating layer is positioned slightly below the surface of the semiconductor, the photoelectric conversion portion can be formed under the insulating layer, so that the practical area of the photoelectric conversion portion increases and the saturation signal amount in miniaturized pixels can be increased. The amount of protrusion of the insulating layer to the surface of the semiconductor is controlled and a surface level difference can be reduced, and gate electrode processing and other production processing can be facilitated.

Further, similarly to the above, a larger saturation signal amount can be obtained by a pixel size of the same area in comparison with the STI isolation method. The occurrence of white spots and dark current caused by pixel defects can be restrained. Since element isolation portion includes an insulating layer, even if part of a gate electrode extends onto the insulating layer, depletion or an inverted layer is prevented from being induced immediately under the insulating layer, so that reliable isolation can be obtained between pixels.

According to a CMOS solid-state imaging device of the present invention, since adjacent pixels are separated by element isolation portion formed of a diffusion layer and an insulating layer thereon and the surface concentration of the diffusion layer is made to be equal to or higher than that of an accumulation layer of a photoelectric conversion portion of a pixel, in addition to the existence of the insulating layer, even if part of a gate electrode extends onto the insulating layer, depletion or an inverted layer is prevented from being induced immediately under the insulating layer, so that reliable isolation can be obtained between pixels.

Further, similarly to the above, element isolation is virtually executed by a diffusion layer, so that the saturation signal amount in miniaturized pixels can be increased by increasing the area of photoelectric conversion portion. In other words, a larger saturation signal amount can be obtained by a pixel size of the same area in comparison with the STI isolation method. In addition, the occurrence of white spots and dark current caused by pixel defects can be restrained.

According to a CMOS solid-state imaging device of the present invention, in a CMOS solid-state imaging device according to claim 6, by gradually lowering the impurity concentration of a diffusion layer of element isolation portion in the depth direction of the substrate, horizontal diffusion of the diffusion layer can be controlled, so that the saturation signal amount in miniaturized pixels increases by increasing the area of the photoelectric conversion portion.

According to a CMOS solid-state imaging device of the present invention, since adjacent pixels are separated by element isolation portion formed of a diffusion layer and an insulating layer thereon and the surface concentration of the diffusion layer at least at the part where a gate electrode extends onto the insulating layer, in the element isolation portion, to be higher than the concentration of an accumulation layer of a photoelectric conversion portion, depletion nor an inverted layer is prevented from being induced immediately under the insulating layer due to the electrical potential of the gate electrode, so that reliable isolation can be obtained between pixels.

Further, similarly to the above, element isolation is virtually executed by a diffusion layer, so that the saturation signal amount in miniaturized pixels increases by increasing the area of the photoelectric conversion portion. In other words, a larger saturation signal amount can be obtained by a pixel size of the same area in comparison with the STI isolation method. In addition, the occurrence of white spots and dark current caused by pixel defects can be restrained.

According to a CMOS solid-state imaging device of the present invention, since a photoelectric conversion portion of a pixel and a source drain region of a transistor of an adjacent pixel are separated by element isolation portion and the source drain region is formed apart from a diffusion layer of the element isolation portion, the junction electric field of the source drain region is weakened. Therefore, the junction pressure resistance of the transistor can be improved.

Further, similarly to the above, since element isolation portion is formed of a diffusion layer and an insulating layer thereon, the saturation signal amount in miniaturized pixels increases by increasing the area of the photoelectric conversion portion and the occurrence of white spots and dark current caused by pixel defects can be restrained.

According to a method of manufacturing a CMOS solid-state imaging device of the present invention, since the production of element isolation portion which includes a diffusion layer and an insulating layer thereon, including the processes of: forming a silicon nitride film on a substrate, forming a silicon oxide film within an opening provided in the silicon nitride film, and removing the silicon nitride film and forming an insulating layer of element isolation portion of the silicon oxide film whose surface protrudes from the surface of the substrate, an insulating layer of element isolation portion having a small area can be formed easily and accurately.

In the above-described process in which the silicon oxide film is formed within the opening, when the silicon oxide film is planarized after the silicon oxide film is formed on the silicon nitride film to be buried in the opening, an insulating layer of element isolation portion having a controlled film thickness and a small area can easily and accurately be formed.

In the above-described process in which the silicon oxide film is formed within the opening, when the silicon oxide film is formed by locally oxidizing the silicon substrate which faces the inside of the opening, an insulating layer of element isolation portion, whose lower surface exists slightly below the surface of the silicon substrate can easily and accurately be formed.

A diffusion layer of element isolation portion can be formed by including the process of performing ion implantation for element isolation into the substrate immediately below the opening, after the above-described opening is formed.

A photoelectric conversion portion whose charge-accumulation region exists under an insulating layer of element isolation portion and is in contact with a diffusion layer can be formed by forming a charge-accumulation region of a photoelectric conversion portion by portion of ion implantation prior to the formation of the above-described silicon oxide film.

According to a drive method of a CMOS solid-state imaging device of the present invention, by setting at least the electrical potential of a source drain region of a transistor of another pixel adjacent to a photoelectric conversion portion of a pixel with element isolation portion in between, to the potential not becoming 0V in the charge-accumulation period of the above-described photoelectric conversion portion, a potential barrier is formed immediately under an insulating layer of the element isolation portion; with this potential barrier, even if depletion or an inverted layer is induced immediately under the insulating layer due to, for example, the electrical potential of a gate electrode which extends onto the insulating layer, electrical charges do not leak from the source drain region into the photoelectric conversion portion, and the CMOS solid-state imaging device can operate favorably.

What is claimed is:
1. A CMOS solid-state imaging device comprising:
a silicon substrate;
a plurality of pixels, each of which includes a photoelectric conversion portion;
an element isolation portion including a diffusion layer and a first insulating layer thereon; and
a second insulating layer on a surface of the silicon substrate, wherein,
  adjacent ones of said plurality of pixels are separated by the element isolation portion, and
  a charge-accumulation region of said photoelectric conversion portion in each of the plurality of pixels extends under the second insulating layer.

2. A CMOS solid-state imaging device comprising:
a plurality of pixels each of which includes a photoelectric conversion portion,
wherein,
  adjacent ones of said plurality of pixels are separated by an element isolation portion formed of a diffusion layer and an insulating layer thereon, and
  the diffusion layer of said element isolation portion at least has surface concentration equal to or higher than that of an accumulation layer of said photoelectric conversion portion.

3. A CMOS solid-state imaging device comprising:
a plurality of pixels each of which includes a photoelectric conversion portion,
wherein,
  adjacent ones of said plurality of pixels are separated by an element isolation portion formed of a diffusion layer and an insulating layer thereon, and
  a surface concentration of said diffusion layer, at least under an area where a gate electrode extends over said insulating layer, is at least higher than a concentration of an accumulation layer of said photoelectric conversion portion.

4. A CMOS solid-state imaging device according to claim 2, wherein an impurity concentration of said diffusion layer of said element isolation portion is gradually lowered in a depth direction.

5. A CMOS solid-state imaging device according to any of claims 1, 2 and 3 wherein said first insulating layer of said element isolation portion is formed in a position equal to the depth of a pn junction including an accumulation layer of a photoelectric conversion portion in each of said plurality of pixels, or in a position shallower than the depth of said pn junction.

6. A CMOS solid-state imaging device according to any of claims 1, 2 and 3, wherein said first insulating layer of said element isolation portion is formed in a depth corresponding to a position between a surface of a semiconductor body in which said plurality of pixels are formed and a pn junction of said photoelectric conversion portion.

7. A CMOS solid-state imaging device according to any of claims 1, 2 and 3,
  wherein,
    each pixel includes a source/drain region, and
    the photoelectric conversion element in a first pixel included in said plurality of pixels and the source/drain region of a transistor in a second pixel adjacent to said first pixel are separated from each other by an element isolation portion formed of a diffusion layer and an insulating layer thereon and wherein said source/drain region is formed apart from said diffusion layer.

* * * * *